United States Patent
Seol et al.

(10) Patent No.: US 7,482,619 B2
(45) Date of Patent: Jan. 27, 2009

(54) CHARGE TRAP MEMORY DEVICE COMPRISING COMPOSITE OF NANOPARTICLES AND METHOD OF FABRICATING THE CHARGE TRAP MEMORY DEVICE

(75) Inventors: Kwang-soo Seol, Suwon-si (KR); Shin-ae Jun, Seongnam-si (KR); Eun-joo Jang, Daejeon-si (KR); Jung-eun Lim, Seongnam-si (KR); Kyung-sang Cho, Gwacheon-si (KR); Byung-ki Kim, Gunpo-si (KR); Jae-ho Lee, Yongin-si (KR); Jae-young Choi, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 170 days.

(21) Appl. No.: 11/517,030

(22) Filed: Sep. 7, 2006

(65) Prior Publication Data
US 2007/0064468 A1 Mar. 22, 2007

(30) Foreign Application Priority Data
Sep. 7, 2005 (KR) ............. 10-2005-0083324
Sep. 5, 2006 (KR) ............. 10-2006-0085295

(51) Int. Cl.
*H01L 29/06* (2006.01)
*H01L 31/00* (2006.01)
*H01L 29/788* (2006.01)
(52) U.S. Cl. ............. 257/24; 257/317; 257/321; 257/E29.168; 257/E21.089; 257/E29.071; 438/962

(58) Field of Classification Search ............. 257/24, 257/317, 321, E29.168, E29.071
See application file for complete search history.

(56) References Cited

U.S. PATENT DOCUMENTS

| 7,355,238 | B2 * | 4/2008 | Takata et al. ............. 257/314 |
| 7,382,017 | B2 * | 6/2008 | Duan et al. ............. 257/321 |
| 7,388,785 | B2 * | 6/2008 | Furnemont ............. 365/185.18 |
| 2004/0066672 | A1 * | 4/2004 | Forbes ............. 365/199 |
| 2004/0110324 | A1 * | 6/2004 | King ............. 438/142 |
| 2004/0110336 | A1 * | 6/2004 | King ............. 438/217 |
| 2004/0110337 | A1 * | 6/2004 | King ............. 438/217 |
| 2004/0110338 | A1 * | 6/2004 | King ............. 438/238 |
| 2004/0110349 | A1 * | 6/2004 | King ............. 438/289 |
| 2005/0064645 | A1 * | 3/2005 | King ............. 438/217 |
| 2005/0072989 | A1 * | 4/2005 | Bawendi et al. ............. 257/200 |
| 2005/0106765 | A1 * | 5/2005 | King ............. 438/14 |
| 2005/0153461 | A1 * | 7/2005 | King ............. 438/3 |
| 2005/0156158 | A1 * | 7/2005 | King ............. 257/20 |
| 2005/0161731 | A1 * | 7/2005 | Ingersoll et al. ............. 257/325 |
| 2005/0174847 | A1 * | 8/2005 | Forbes ............. 365/185.08 |

(Continued)

FOREIGN PATENT DOCUMENTS

KR 1020050108126 A 11/2005
KR 1020050111046 A 11/2005

*Primary Examiner*—Ngan Ngo
(74) *Attorney, Agent, or Firm*—Cantor Colburn LLP

(57) ABSTRACT

Provided are a charge trap memory device including a substrate and a gate structure including a charge trapping layer formed of a composite of nanoparticles, and a method of manufacturing the charge trap memory device.

25 Claims, 7 Drawing Sheets

U.S. PATENT DOCUMENTS

| | | | |
|---|---|---|---|
| 2005/0199947 A1* | 9/2005 | Forbes | 257/325 |
| 2005/0205860 A1* | 9/2005 | Hsu et al. | 257/40 |
| 2005/0211978 A1* | 9/2005 | Bu et al. | 257/40 |
| 2005/0216075 A1* | 9/2005 | Wang et al. | 623/1.15 |
| 2005/0253133 A1* | 11/2005 | King | 257/25 |
| 2005/0260798 A1* | 11/2005 | King | 438/142 |
| 2005/0265063 A1* | 12/2005 | Forbes | 365/63 |
| 2005/0274986 A1* | 12/2005 | Sirringhaus et al. | 257/213 |
| 2006/0019441 A1* | 1/2006 | Jeng et al. | 438/222 |
| 2006/0050565 A1* | 3/2006 | Yeh et al. | 365/185.26 |
| 2006/0170050 A1* | 8/2006 | Forbes | 257/347 |
| 2006/0212976 A1* | 9/2006 | Khang et al. | 977/842 |
| 2006/0215452 A1* | 9/2006 | Forbes | 365/185.08 |
| 2006/0231889 A1* | 10/2006 | Chen et al. | 257/325 |
| 2006/0284082 A1* | 12/2006 | Furnemont | 250/307 |
| 2006/0291287 A1* | 12/2006 | Furnemont | 365/185.18 |
| 2007/0014151 A1* | 1/2007 | Zhang et al. | 365/185.01 |
| 2007/0034933 A1* | 2/2007 | Kim et al. | 257/314 |
| 2007/0064478 A1* | 3/2007 | Zhang et al. | 365/185.01 |
| 2007/0091661 A1* | 4/2007 | Forbes | 365/94 |
| 2007/0092989 A1* | 4/2007 | Kraus et al. | 438/99 |
| 2007/0187768 A1* | 8/2007 | Duan et al. | 257/368 |
| 2007/0228454 A1* | 10/2007 | Sugizaki | 257/316 |
| 2008/0020524 A1* | 1/2008 | King | 438/197 |
| 2008/0026532 A1* | 1/2008 | Duan et al. | 438/287 |
| 2008/0150004 A1* | 6/2008 | Chen et al. | 257/324 |

* cited by examiner

CHARGE TRAP MEMORY DEVICE COMPRISING COMPOSITE OF NANOPARTICLES AND METHOD OF FABRICATING THE CHARGE TRAP MEMORY DEVICE

CROSS-REFERENCE TO RELATED PATENT APPLICATIONS

This application claims the benefit of Korean Patent Application Nos. 10-2005-0083324 and 10-2006-0085295, filed on Sep. 7, 2005 and Sep. 5, 2006, in the Korean Intellectual Property Office, the disclosure of which is incorporated herein in its entirety by reference.

BACKGROUND OF THE INVENTION

1. Field of the Invention

The present invention relates to a memory device and a method of fabricating the same, and more particularly, to a charge trap memory device using a composite of nanoparticles and a method of fabricating the charge trap memory device.

2. Description of the Related Art

Non-volatile memory devices are a data storing device that can retain stored data without loss even when the supply of power is interrupted. Flash memory device are a representative example of non-volatile memory device.

Flash memory devices can be classified into either floating gate memory devices in which charges are accumulated in a floating gate formed between dielectric layers and charge trap memory devices in which charges are accumulated in a charge trapping layer that is formed between dielectric layers and acts as a storage node.

An example of a charge trap memory device includes a silicon-oxide-nitride-oxide-silicon (SONOS) memory device using a silicon nitride layer as the charge trapping layer. The SONOS memory device has a structure in which a tunnel insulating layer, a charge trapping layer, and a blocking insulating layer are sequentially stacked on a silicon substrate in which source and drain regions are formed, and a gate electrode is formed on the blocking insulating layer. The tunnel insulating layer and the blocking insulating layer may be formed of $SiO_2$, and the charge trapping layer may be formed of a silicon nitride ($Si_3N_4$) layer.

A charge trap memory device using nanoparticles as the charge trapping layer have been vigorously researched in recent years. Metal and semiconductor nanoparticles have large work functions and can stably store electrons transported from an electrode, and thus can serve as trap sites storing charges passing through the tunnel insulating layer.

In order to satisfy the requirement for flash memory devices having larger memory capacity that increases annually, the sizes of memory cells rapidly decrease. In addition, in charge trap memory devices, many efforts have been devoted to the manufacture of a flash memory device that can store charges while remaining data stored by a leakage current for a long time and that has smaller memory cells. Thus, it is likely to implement a highly integrated memory having very small memory cells using a single nanoparticle as a separate memory cell.

However, when more nanoparticles are used in a unit area in order to increase the integration density of memory, due to the increasing of charge accumulated in the nanoparticles, the speed and performance of the memory are improved. However, as the density of nanoparticles increases, the distance between the nanoparticles becomes shorter, thereby increasing a leakage current to the tunneling between the nanoparticles. A larger leakage current leads to shorter information retention time and poor memory performance. In addition, a higher density of nanoparticles leads to the agglomeration of the metal nanoparticles in a memory manufacturing process and lowers the performance of the memory device.

SUMMARY OF THE INVENTION

The present invention provides a charge trap memory device using a composite of charge trapping nanoparticles and insulating nanoparticles and a method of fabricating the charge trap memory device. The charge trap memory device does not have a problem of leakage current increase or nanoparticle agglomeration, which occur when an electron trap layer is formed of only metal or semiconductor nanoparticles.

According to an aspect of the present invention, there is provided a charge trap memory device comprising: a substrate; and a gate structure including a charge trapping layer, wherein the charge trapping layer is formed of a composite of charge trapping nanoparticles and insulating nanoparticles.

The composite may be prepared by solidifying a composite solution of charge trapping nanoparticles and insulating nanoparticles, and the charge trapping nanoparticles and the insulating nanoparticles in the composite solution may be capped with a surfactant by a liquid synthesis process using an organic solvent to allow the charge trapping nanoparticles and the insulating nanoparticles to be miscible together.

The surfactant may be at least one selected from the group consisting of a $C_6$-$C_{22}$ alkane or alkene group having a —COOH group at its terminal; a $C_6$-$C_{22}$ alkane or alkene group having a —POOH group at its terminal; a $C_6$-$C_{22}$ alkane or alkene group having a —SOOH group at its terminal; and a $C_6$-$C_{22}$ alkane or alkene group having a —$NH_2$ group at its terminal.

The surfactant may be at least one selected from the group consisting of oleic acid, stearic acid, palmitic acid, hexyl phosphonic acid, n-octyl phosphonic acid, tetradecyl phosphonic acid, octadecyl phosphonic acid, n-octyl amine, and hexadecyl amine.

The charge trapping nanoparticles may comprise any one kind of nanoparticles or at least two kinds of nanoparticles selected from among metal nanoparticles of at least one element or an alloy of at least two elements selected from the group consisting of Pt, Pd, Ni, Ru, Co, Cr, Mo, W, Mn, Fe, Ru, Os, Ph, Ir, Ta, Au, and Ag; Group IV semiconductor nanoparticles selected from monoatomic compounds including Si and Ge and binary compounds including SiC and SiGe; Group II-VI compound semiconductor nanoparticles selected from the group consisting of binary compounds including CdSe, CdTe, ZnS, ZnSe, Zone, ZnO, HgS, HgSe, and HgTe, ternary compounds including CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, and HgZnSe, quaternary compounds including HggZnTe, CdZnSeS, CdZnSeTe, CdZnSTe, CdHgSeS, CdHgSeTe, CdHgSTe, HgZnSeS, HgZnSeTe, and HgZnSTe; Group III-V compound semiconductor nanoparticles selected from the group consisting of binary compounds including GaN, GaP, GaAs, GaSb, AlN, AlP, AlAs, AlSb, InN, InP, InAs, and InSb, ternary compounds including GaNP, GaNAs, GaNSb, GaPAs, GaPSb, AlNP, AlNAs, AlNSb, AlPAs, AlPSb, InNP, InNAs, InNSb, InPAs, InPSb, and GaAlNP, and quaternary compounds including GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, and InAlPSb; and Group IV-VI compound semiconductor nanoparticles selected from the group consisting of binary compounds including SnS, SnSe, SnTe, PbS, PbSe, and PbTe, ternary compounds including SnSeS, SnSeTe, SnالسTe, PbSeS, PbSeTe, PbSTe, SnPbS, SnPbSe, and SnPbTe, and quaternary compounds including SnPbSSe, SnPbSeTe, and SnPbSTe. The binary compounds, the ternary compounds, or the quaternary compounds can exist in homogeneous concentration in the charge trapping nanoparticles or may have locally different concentration distributions in the charge trapping nanoparticles. Accordingly, the charge trapping nanoparticles can have an alloy, core-shell, or multi-shell structure.

The insulating nanoparticles ensure a distance between the charge trapping nanoparticles to prevent an increase in leakage current or the agglomeration of the charge trapping nanoparticles. The insulating nanoparticles can be at least one kind of nanoparticles selected from the group consisting of oxide nanoparticles including ZnO, $ZrO_2$, $SiO_2$, $SnO_2$, $TiO_2$, $HfO_2$, $BaTiO_3$, $CeO_2$, $Al_2O_3$, $Ta_2O_5$, and $In_2O_3$; nitride nanoparticles including silicon nitride and silicon oxynitride; nanoparticles including C(carbon or diamond); Group II-V compound semiconductor nanoparticles; and Group III-V compound semiconductor nanoparticles. To improve memory characteristics, the insulating nanoparticles may have a larger energy band gap than the charge trapping nanoparticles. When the same kinds of nanoparticles are used as the charge trapping nanoparticles and the insulating nanoparticles, nanoparticles having a smaller work function act as the charge trapping nanoparticles.

The gate structure may further comprise: a tunnel insulating layer between the substrate and the charge trapping layer; a blocking insulating layer formed on the charge trapping layer; and a gate electrode formed on the blocking insulating layer.

The charge trap memory device may further comprise first and second impurity regions in the substrate, the first and second impurity regions contacting the tunnel insulating layer.

According to another embodiment of the present invention, there is provided a method of manufacturing a charge trap memory device comprising a gate structure including a charge trapping layer on a substrate, the method comprising forming the gate structure including forming the charge trapping layer, wherein the forming of the charge trapping layer comprises: coating a composite solution of charge trapping nanoparticles and insulating nanoparticles; and solidifying the composite solution to form composite of charge trapping nanoparticles and insulating nanoparticles for the charge trapping layer.

The composite solution may be coated using one of spin coating, dip coating, drop casting, and self-assembling.

The forming of the gate structure may further comprise: forming a tunnel insulating layer on the substrate before the forming of the charge trapping layer; forming a blocking insulating layer on the charge trapping layer; and forming a gate electrode on the blocking insulating layer.

The method may further comprise forming first and second impurity regions in the substrate, the first and second impurity regions contacting the tunnel insulating layer.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Embodiments of a charge trap memory device including a composite of nanoparticles and a method of fabricating the charge trap memory device according to the present invention will be described in detail with reference to the appended drawings.

Figure 1:
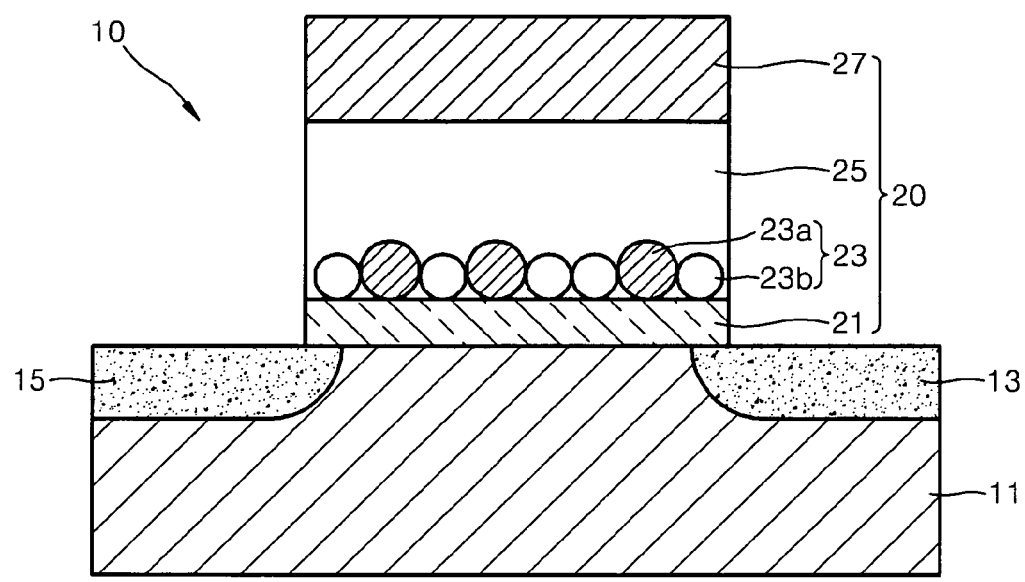
FIGS. 1 and 2 are schematic views of charge trap memory devices according to embodiments of the present invention.

FIG. 1 is a schematic view of a charge trap memory device 10 according to an embodiment of the present invention. In FIG. 1, the thicknesses of layers and regions are exaggerated for clarity.

Referring to FIG. 1, the charge trap memory device 10 includes a substrate 11 and a gate structure 20 formed on the substrate 11.

First and second impurity regions 13 and 15 doped with predetermined conductive impurities are formed in the substrate 11. One of the first and second impurity regions 13 and 15 can be used as a drain D, and the other one can be used as a source S. The gate structure 20 includes a charge trapping layer 23. A tunnel insulating layer 21 is formed between the substrate 11 and the charge trapping layer 23. The tunnel insulating layer 21 is formed on the substrate 11 to contact the first and second impurity regions 13 and 15. A blocking insulating layer 25 is formed on the charge trapping layer 23. A gate electrode 27 may be formed on the blocking insulating layer 25. The tunnel insulating layer 21, the charge trapping layer 23, the blocking insulating layer 25, and the gate electrode 27 are sequentially formed on the substrate 11.

The tunnel insulating layer 21 may have a single layer structure formed of, for example, $SiO_2$. Alternatively, the tunnel insulating layer 21 may have a multi-layer structure formed of materials having different energy band gaps. A memory device having a multi-layer structured tunnel insulating layer is disclosed in Korean Patent Application No. 2005-111046 by the applicant, the disclosure of which is incorporated herein in its entirety by reference, and is not described in detail here.

The blocking insulating layer 25 may have a single layer or multi-layer structure. When the blocking insulating layer 25 has a single layer structure, the blocking insulating layer 25 may be formed of $SiO_2$ or a high-k material having a higher dielectric constant than a material used for the tunnel insulating layer 21, for example, $Si_3N_4$, $Al_2O_3$, $HfO_2$, $Ta_2O_5$, or $ZrO_2$. Alternatively, when the blocking insulating layer 25 has a multi-layer structure, the blocking insulating layer 25 may include at least two layers including, for example, an insulating layer formed of a common insulating material, such as $SiO_2$, and a high dielectric layer formed of a material having a higher dielectric constant than a material used for the tunnel insulating layer 21. Such a blocking insulating layer having a single layer structure or a multi-layer structure including a high dielectric layer is disclosed in Korean Patent Application No. 2005-108126 by the applicant, the disclosure of which is incorporated herein in its entirety by reference, and is not described in detail here.

FIG. 1 illustrates examples of the tunnel insulating layer 21 and the blocking insulating layer 25, each of which has a single layer structure.

The gate electrode 27 may be formed of a metal layer. For example, the gate electrode 27 may be formed of aluminum (Al). In addition, the gate electrode 17 can be formed of a metal, such as Ru or TaN, a siliciide, such as NiSi, etc., which are typically used as materials for the gate electrode of a semiconductor memory device.

In the charge trap memory device 10 according to an embodiment of the present invention, the charge trapping layer 23 includes a composite of charge trapping nanoparticles 23a and insulating nanoparticles 23b.

The charge trapping layer 23 can be formed by solidifying a composite solution of charge trapping nanoparticles 23a and insulating nanoparticles 23b. Here, each of the charge trapping nanoparticles 23a and the insulating nanoparticles 23b may be capped with a surfactant in a liquid synthesis process using an organic solvent to be miscible together.

The charge trapping nanoparticles 23a (hereinafter, also simply referred to as "nanoparticles 23a" if required) can be any one kind of nanoparticles or at least two kind of nanoparticles selected from metal nanoparticles of at least one element or an alloy of at least two elements selected from the group consisting of Pt, Pd, Ni, Ru, Co, Cr, Mo, W, Mn, Fe, Ru, Os, Ph, Ir, Ta, Au, and Ag; Group IV semiconductor nanoparticles selected from monoatomic compounds including Si and Ge and binary compounds including SiC and SiGe; Group II-VI compound semiconductor nanoparticles selected from the group consisting of binary compounds including CdSe, CdTe, ZnS, ZnSe, ZnTe, ZnO, HgS, HgSe, and HgTe, ternary compounds including CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, and HgZnSe, quaternary compounds including HggZnTe, CdZnSeS, CdZnSeTe, CdZnSTe, CdHgSeS, CdHgSeTe, CdHgSTe, HgZnSeS, HgZnSeTe, and HgZnSTe; Group III-V compound semiconductor nanoparticles selected from the group consisting of binary compounds including GaN, GaP, GaAs, GaSb, AlN, AlP, AlAs, AlSb, InN, InP, InAs, and InSb, ternary compounds including GaNP, GaNAs, GaNSb, GaPAs, GaPSb, AlNP, AlNAs, AlNSb, AlPAs, AlPSb, InNP, InNAs, InNSb, InPAs, InPSb, and GaAlNP, and quaternary compounds including GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, and InAlPSb; and Group IV-VI compound semiconductor nanoparticles selected from the group consisting of binary compounds including SnS, SnSe, SnTe, PbS, PbSe, and PbTe, ternary compounds including SnSeS, SnSeTe, SnSTe, PbSeS, PbSeTe, PbSTe, SnPbS, SnPbSe, and SnPbTe, and quaternary compounds including SnPbSSe, SnPbSeTe, and SnPbSTe; etc. The binary compounds, the ternary compounds, or the quaternary compounds can exist in the homogeneous concentration in the charge trapping nanoparticles 23a or may have locally different concentration distributions in the charge trapping nanoparticles 23a. Accordingly, the charge trapping nanoparticles 23a can have an alloy, core-shell, or multi-shell structure. Such nanoparticles 23a have a high work function and thus can stably store electrons transported from an electrode.

The insulating nanoparticles 23b ensure a distance between the charge trapping nanoparticles 23a to prevent an increase in leakage current or the agglomeration of the charge trapping nanoparticles 23a. The insulating nanoparticles 23b can be at least one kind of nanoparticles selected from the group consisting of oxide nanoparticles including ZnO, $ZrO_2$, $SiO_2$, $SnO_2$, $TiO_2$, $HfO_2$, $BaTiO_3$, $CeO_2$, $Al_2O_3$, $Ta_2O_5$, and $In_2O_3$; nitride nanoparticles including silicon nitride and silicon oxynitride; nanoparticles including C(carbon or diamond); Group II-V compound semiconductor nanoparticles; and Group III-V compound semiconductor nanoparticles. To improve memory characteristics, the insulating nanoparticles 23b may have a larger energy band gap than the charge trapping nanoparticles 23a. When the same kinds of nanoparticles are used as the charge trapping nanoparticles 23a and the insulating nanoparticles 23b, nanoparticles having a smaller work function act as the charge trapping nanoparticles 23a. The nanoparticles 23a, which constitute the charge trapping layer 23 together with the insulating nanoparticles 23b, act as trapping sites storing charges passing the tunnel insulating layer 21.

Here, the nanoparticles 23a have a large work function and can stably store electrons transported from an electrode, and thus are suitable as a charge trapping material of a memory device. In addition, when the nanoparticles 23a are metal nanoparticles having a high conductivity, the metal nanoparticles 23a can be used to form an electrode. The nanoparticles 23a, which have a nanoscale size, can be used as a catalyst due to a large number of active electrons exposed to their surface having a larger area compared to their volume.

Here, the insulating nanoparticles 23b can have insulating characteristics, semiconductor characteristics, or metallic characteristics according to the dielectric constant. In addition, the insulating nanoparticles 23b can exhibit various characteristics, for example, can generate a current as a result of the generation of electrons and holes occurring when excited by light or can emit light. For example, when the nanoparticles 23b are formed of $SiO_2$, which is an insulator, the insulating nanoparticles 23b can be used as a low-k dielectric material having low dielectric constant. When the nanoparticles 23b are formed of ZnO, $TiO_2$, CdSe, CdS, CdTe, ZnS, PbS, InP, etc., the nanoparticles 23b can be used in photocatalysts or solar cells as a current generating or transporting material when excited by light. When the nanoparticles 23b are formed of $HfO_2$, $ZrO_2$, or $Si_3N_4$, which have high dielectric constants, the nanoparticles 23b can be used as a high-k material. When the nanoparticles 23b are formed of ITO, fluorine-doped tin oxide (FTO), etc., the nanoparticles 23b can be used as an electrode.

According to the present invention, the nanoparticles 23a and the insulating nanoparticles 23b are capped with a surfactant. Accordingly, the nanoparticles 23a and the insulating nanoparticles 23b can be synthesized by a simple liquid process to have a very uniform size distribution. In addition, the sizes of the nanoparticles 23a and the insulating nanoparticles 23b can be adjusted according to the synthesis conditions.

Accordingly, when the nanoparticles 23a and the insulating nanoparticles 23b, which are to be used in various application fields, are synthesized by a liquid process, the sizes, size distribution, and surface condition of the nanoparticles 23a and the insulating nanoparticles 23b, the density of a thin film formed of the same, etc., can be easily controlled. In addition, since the nanoparticles 23a and the insulating nanoparticles 23b are synthesized at a comparatively high temperature in an organic solvent, the nanoparticles 23a and the insulating nanoparticles 23b have good crystalinity and are stable, and thus being prevented from agglomerating. Thus, the nanoparticles 23a and the insulating nanoparticles 23b can be used in a higher concentration, and thus are protected from being contaminated by water when applied to a device.

When a mixture of a solution of nanoparticles 23a and a solution of insulating nanoparticles 23b are used, a device having at least two characteristics can be manufactured. In addition, the ratio of two different kinds of nanoparticles can be easily varied according to the characteristics of a desired device.

A composite of the nanoparticles 23a and the insulating nanoparticles 23b obtained by mixing the nanoparticles 23a and the insulating nanoparticles 23b, which are synthesized in an organic solvent, in a proper ratio and solidifying the mixture exhibit intrinsic characteristics of both the nanoparticles 23a and the insulating nanoparticles 23b.

The composite of the nanoparticles 23a and the insulating nanoparticles 23b suggested in the present invention has various advantages. For example, the composite of the nanoparticles 23a and the insulating nanoparticles 23b can be simply prepared, the ratio of the nanoparticles 23a and the insulating nanoparticles 23b can be easily controlled, and the sizes and the size distributions of the nanoparticles 23a and the insulating nanoparticles 23b can be controlled.

The composite of the nanoparticles 23a and the insulating nanoparticles 23b suggested in the present invention can be used in various fields.

For example, when a composite of nanoparticles of Pt, Pd, Au, Si, etc., which have large charge storage capacities due to a high work function, and insulating nanoparticles of $HfO_2$, $ZrO_2$, $Si_3N_4$, etc., which have high dielectric constants, is used in a charge trap memory device, due to the charge trapping nanoparticles existing among the insulating nanoparticles, charges stored in the charge trap memory device do not easily leak. In addition, degradation in performance due to the agglomeration of nanoparticles, which occurs in a device manufacturing process when only the charge trapping nanoparticles are used, can be prevented. In addition, by changing the ratio of the insulating nanoparticles to the charge trapping nanoparticles, the distance between and the density of the charge trapping nanoparticles can be easily controlled.

In another example, when a composite of charge trapping nanoparticles of Pt, Pd, Au, Si, etc., and insulating nanoparticles of ZnO, $TiO_2$, CdSe, CdS, CdTe, ZnS, PbS, InP, etc., which easily generate electrons and holes when excited by light, i.e., photons, is used in a memory device, a photon-induced charge trap memory device in which the electrons generated from the insulating nanoparticles by photons are stored in other nanoparticles can be manufactured.

Thus, the charge trap memory device 10 according to an embodiment of the present invention can be a common charge trap memory device or a photo-induced charge trap memory device according to the materials of the nanoparticles 23a and insulating nanoparticles 23b used to form the charge trapping layer 23. The charge trap memory device 10 according to the present invention includes both of the charge trap memory devices of above two concepts.

In addition, in the composite of the nanoparticle 23a and the insulating nanoparticles 23b suggested in the present invention, when the nanoparticles 23a are formed of Cu, Ag, Au, Pt, etc., which are highly conductive and smoothly pass electrons, and the insulating nanoparticles 23b are formed of ZnO, $TiO_2$, CdSe, CdS, CdTe, ZnS, PbS, InP, etc., which smoothly generate electrons and holes by being excited to light, the electrons generated from the insulating nanoparticles 23b can easily migrate to an electrode due to the highly conductive nanoparticles 23a. Accordingly, based on this electron migration phenomenon, a solar cell can be implemented. In other words, a solar cell can be manufactured using the composite of nanoparticles suggested in the present invention.

FIG. 1 illustrates a single stack structure of the charge trapping layer 23 including the charge trapping nanoparticles 23a and the insulating nanoparticles 23b in a singlestack.

Figure 2:
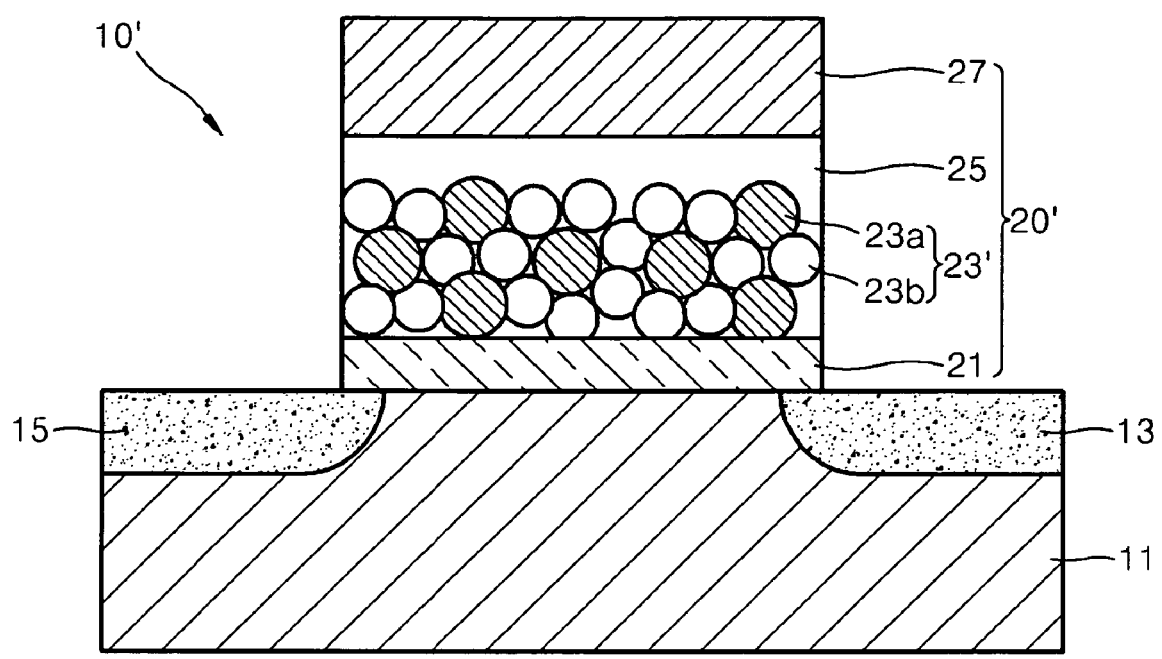

Instead of the structure in FIG. 1, as illustrated in FIG. 2, a charge trapping layer 23' may have multiple stack structure including the charge trapping nanoparticles 23a and the insulating nanoparticle 23b in multiple stack. FIG. 2 is a schematic view of a charge trap memory device 10' according to another embodiment of the present invention. The charge trap memory device 10' according to another embodiment of the present invention includes a substrate 11 and a gate structure 20' formed on the substrate 11. The charge trap memory device 10' is substantially the same as the charge trap memory device 10 in FIG. 1, except that the charge trapping layer 23' in the gate structure 20' includes the nanoparticles 23a and the insulating nanoparticle 23b in multiple stack.

Hereinafter, preparing a composite solution of the charge trapping nanoparticles 23a and the insulating nanoparticles 23b and forming the charge trapping layer 23 (23') of the charge trap memory device 10 (10') according to embodiments of the present invention using the composite solution will be described in detail.

Figure 3:
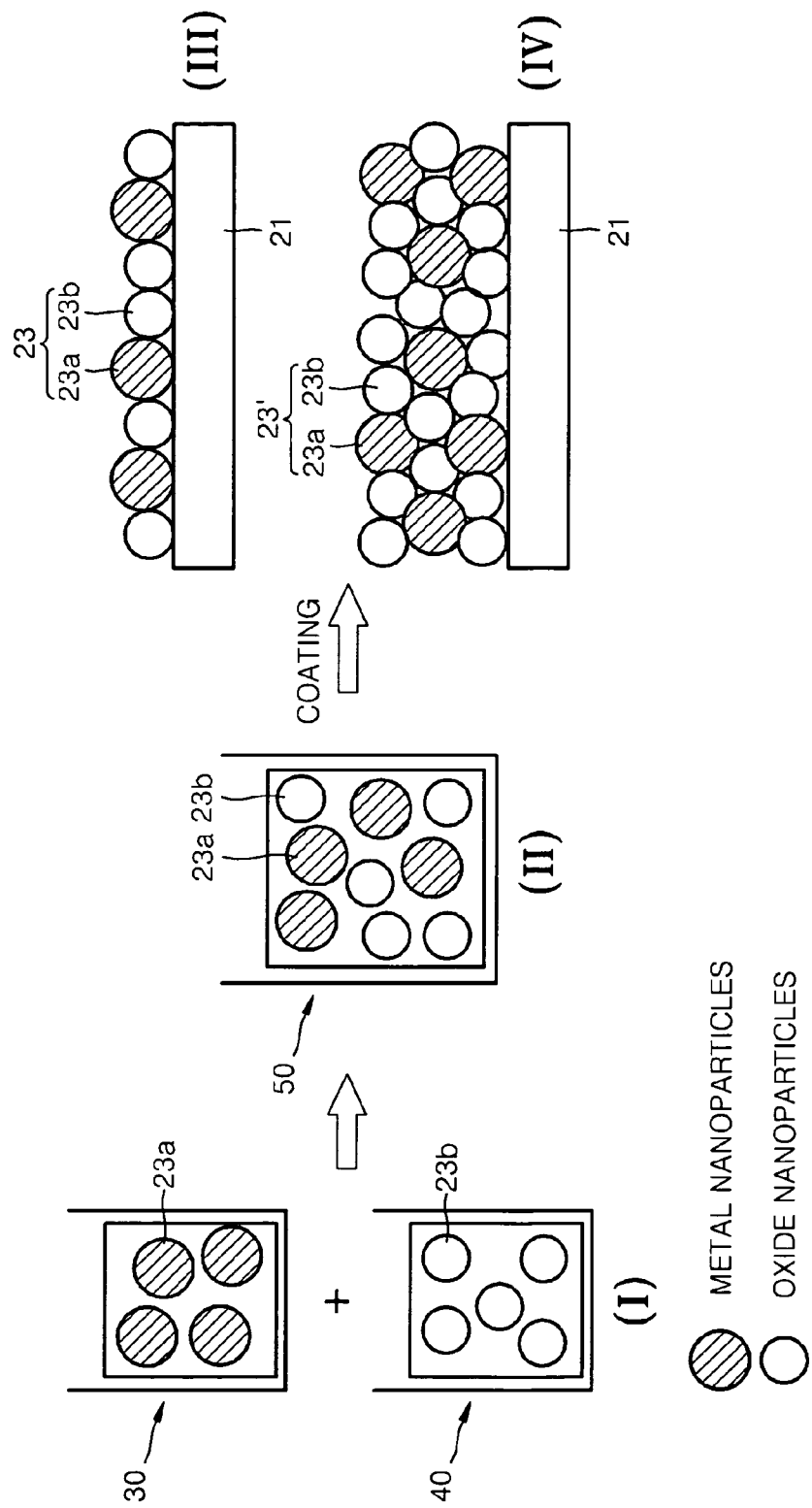
FIG. 3 illustrates a process of preparing a composite solution of charge trapping nanoparticles and insulating nanoparticles and coating the composite solution on a tunnel insulating layer of FIG. 1 to form a charge trapping layer including the composite of the charge trapping nanoparticles and the insulating nanoparticles.

FIG. 3 illustrates a process of preparing a composite solution of the charge trapping nanoparticles 23a and the insulating nanoparticles 23b and coating the composite solution on the tunnel insulating layer 21 of FIG. 1 to form the charge trapping layer 23 (23') including the composite of the nanoparticles 23a and the insulating nanoparticles 23b.

Referring to FIG. 3, in order to prepare the composite of the nanoparticles 23a and the insulating nanoparticles 23b suggested in the present invention, initially, a solution 30 of the nanoparticles 23a and a solution 40 of the insulating nanoparticles 23b are prepared by capping the nanoparticles 23a and the insulating nanoparticles 23b with a surfactant, which allows nanoparticles 23a and the insulating nanoparticles 23b to be miscible together, through a liquid synthesis process using an organic solvent (Operation I). A homogeneous composite solution 50 having a desired particle size, desired particle distribution and a desired particle density is prepared using the solutions 30 and 40 (Operation II). Next, the composite solution 50 is coated on the tunnel insulating layer 21 (Operations III and IV).

Here, before the mixing of the two solutions 30 and 40 to prepare the composite solution 50, an excess of the surfactant, which may exist in the solution, may be removed through a washing process to prevent agglomeration of the nanoparticles 23a and 23b. In addition, a precursor added for a reaction may remain and damage the charge trapping nanoparticles 23a or the insulating nanoparticles 23b. In this case, the two solutions 30 and 40 may be mixed after removing the precursor and then a washing process.

Examples of the surfactant surrounding the nanoparticles include: a $C_6$-$C_{22}$ alkane or alkene group having a —COOH group at its terminal; a $C_6$-$C_{22}$ alkane or alkene group having a —POOH group at its terminal; a $C_6$-$C_{22}$ alkane or alkene group having a —SOOH group at its terminal; a $C_6$-$C_{22}$ alkane or alkene group having a —$NH_2$ group at its terminal; etc.

Specific examples of the surfactant include oleic acid, stearic acid, palmitic acid, hexyl phosphonic acid, n-octyl phosphonic acid, tetradecyl phosphonic acid, octadecyl phosphonic acid, n-octyl amine, hexadecyl amine, etc.

When the surfactant surrounding the nanoparticles exhibit different properties and does not allow the nanoparticles 23a and 23b to be miscible in a solvent, the two solutions 30 and 40 can be mixed after an additional process of substituting the surfactant.

The composite solution 50 may be coated using one of spin coating, dip coating, drop casting, and self-assembling.

The composite solution 50 may be coated to form the charge trapping layer 23 having the structure in (III) of FIG. 3, which includes the nanoparticles 23a and the insulating nanoparticles 23b in a single stack, or to form the charge trapping layer 23' having the structure in (IV) of FIG. 3, which includes the nanoparticles 23a and the insulating nanoparticles 23b in multiple stack. When the charge trapping layer 23 having the structure in (III) of FIG. 3, which includes the nanoparticles 23a and the insulating nanoparticles 23b in a single stack, the charge trap memory device 10 in FIG. 1 may be obtained. When the charge trapping layer 23' having the structure in (IV) of FIG. 3, which includes the nanoparticles 23a and the insulating nanoparticles 23b in multiple stack, the charge trap memory device 10' of FIG. 2 may be obtained.

As the composite solution 50 coated on the tunnel insulating layer 21 is solidified, the charge trapping layer 23 (23') containing the composite of the charge trapping nanoparticles 23a and the insulating nanoparticles 23b is formed. A process of forming the gate structure 20 (20') of the charge trap memory device 10 (10') in FIG. 1 (FIG. 2) is as follows.

Initially, before the charge trapping layer 23(23') is formed, the tunnel insulating layer 21 is formed on the substrate 11. Next, the charge trapping layer 23(23') is formed in the same manner as described above. After the charge trapping layer 23 (23') is formed, the blocking insulating layer 25 is formed on the charge trapping layer 23(23'), and the gate electrode 27 is formed thereon.

The first and second impurity regions 13 and 15 contacting the tunnel insulating layer 21 may be further formed in the substrate 11.

Hereinafter, the preparing of a composite solution of charge trapping nanoparticles and insulating nanoparticles and the manufacturing of a charge trap memory device using the composite solution will be described with reference to exemplary embodiments, which are for illustrative purpose only and are not intended to limit the scope of the invention.

Initially, a process of preparing a composite solution of Pd nanoparticles and $ZrO_2$ nanoparticles according to an embodiment of the present invention will be described below.

Figure 4:
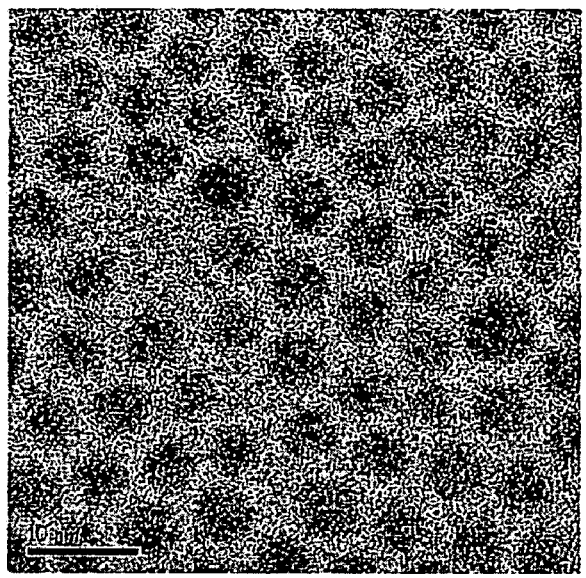
FIG. 4 is an electromicroscopic photograph of Pd nanoparticles used in the present invention.

1 mL of TOP, 9 mL of olelyamine, and 0.1 g of Pd acetylacetonate are simultaneously put into a 125-ml flask with a reflux condenser, and the reaction temperature is slowly raised to 260° C. while stirring to allow reaction for about 30 minutes under the reaction temperature of 260° C. After the reaction is completed, the temperature of the reaction mixture is dropped as quickly as possible, and ethanol, which is a non-solvent, is added to perform centrifugation. The supernatant obtained as a result of the centrifugation is removed, and the precipitate is dispersed in chloroform to obtain an about 1 wt % solution. An electromicroscopic photograph of the prepared Pd nanoparticles is shown in FIG. 4.

Figure 5:
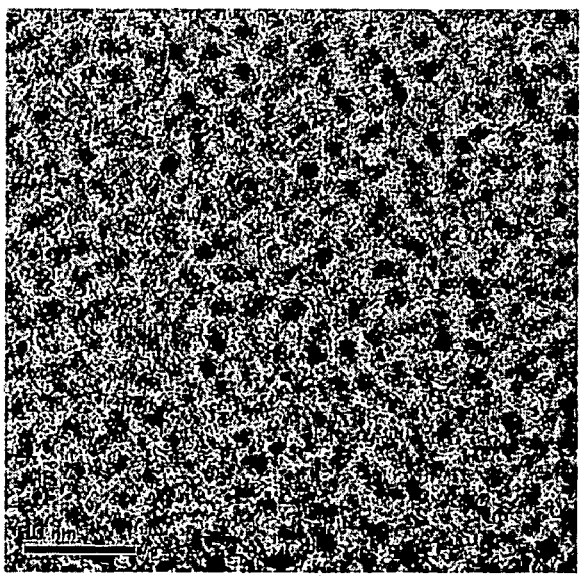
FIG. 5 is an electromicroscopic photograph of $ZrO_2$ nanoparticles used in the present invention.

1.4 mL of oleic acid, 10 mL of trioctylamine, 1 mL of oleylamine, 0.6 g of zirconium chloride are simultaneously put into a 125-ml flask with a reflux condenser, and the reaction temperature is slowly raised to 320° C. while stirring to allow reaction for about 1 hour under the reaction temperature of 320° C. After the reaction is completed, the temperature of the reaction mixture is dropped as quickly as possible, and ethanol, which is a non-solvent, is added to perform centrifugation. The supernatant obtained as a result of the centrifugation is removed, and the precipitate is dispersed in chloroform to obtain an about 1 wt % solution. An electromicroscopic photograph of the prepared $ZrO_2$ nanoparticles is shown in FIG. 5.

Before the mixing of the separate solutions to prepare the composite solution, an excess of the surfactant, which may exist in the solution, is removed through several washing processes to prevent the agglomeration of the nanoparticles. Especially, in the solution of $ZrO_2$ nanoparticles, an excess surfactant and chloride remain and may damage the Pd nanoparticles. Accordingly, the solution of $ZrO_2$ nanoparticles is washed at least two times using an acetone-chloroform solution.

Figure 6:
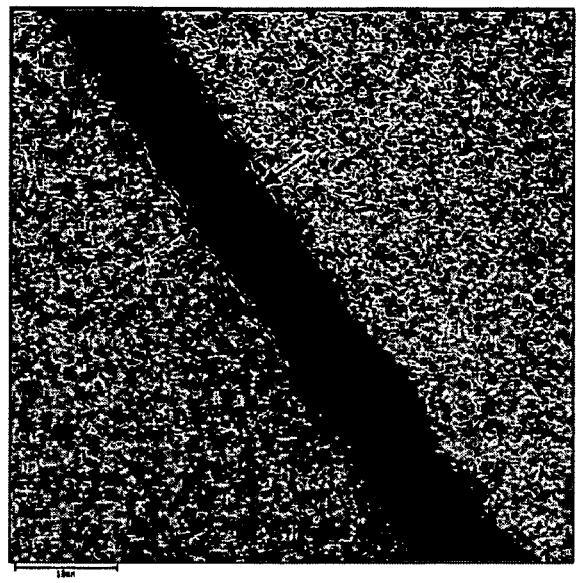
FIG. 6 is an electromicroscopic photograph of a section of a thin film formed of the composite of Pd nanoparticles and $ZrO_2$ nanoparticles in a single stack.

When a composite solution prepared by mixing 1 mL of a chloroform solution containing 0.5 wt % Pd nanoparticles and 2 mL of a chloroform solution containing 0.5 wt % $ZrO_2$ nanoparticles is coated on a silicon (Si) wafer at 2000 rpm, the composite of Pd nanoparticles and $ZrO_2$ nanoparticles in a single stack is obtained as shown in FIG. 6.

Figure 7:
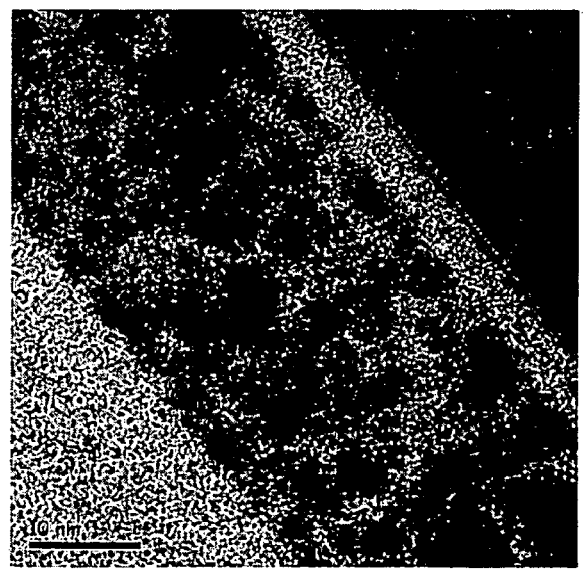
FIG. 7 is an electromicroscopic photograph of a section of a thin film formed of the composite of Pd nanoparticles and $ZrO_2$ nanoparticles in multiple stack.

When a composite solution prepared by mixing 1 mL of a chloroform solution containing 1 wt % Pd nanoparticles and 3 mL of a chloroform solution containing 1 wt % $ZrO_2$ nanoparticles is coated on a Si wafer at 1500 rpm, the composite of Pd nanoparticles and $ZrO_2$ nanoparticles in multiple stack is obtained as shown in FIG. 7.

A process of manufacturing a charge trap memory device using a composite of Pd nanoparticles and $ZrO_2$ nanoparticles as describe above according to an embodiment of the present invention will be described below.

Figure 8:
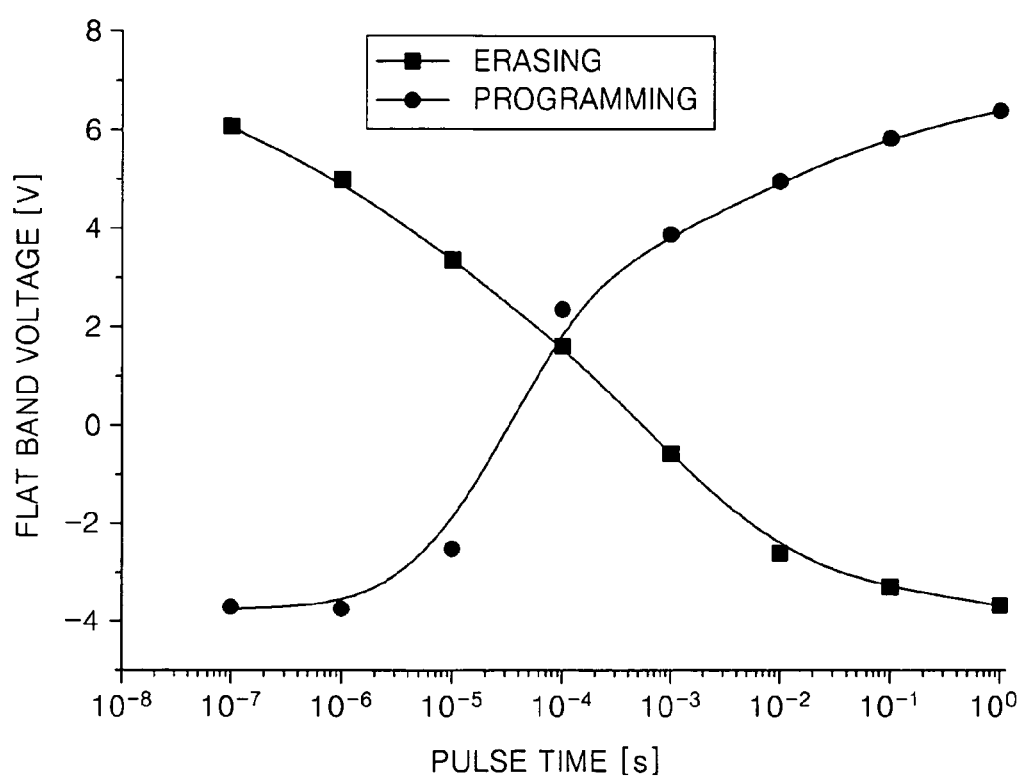
FIGS. 8 and 9 are graphs showing program/erase characteristics and charge retention characteristics of a charge trap memory device according to the present invention.
Figure 9:
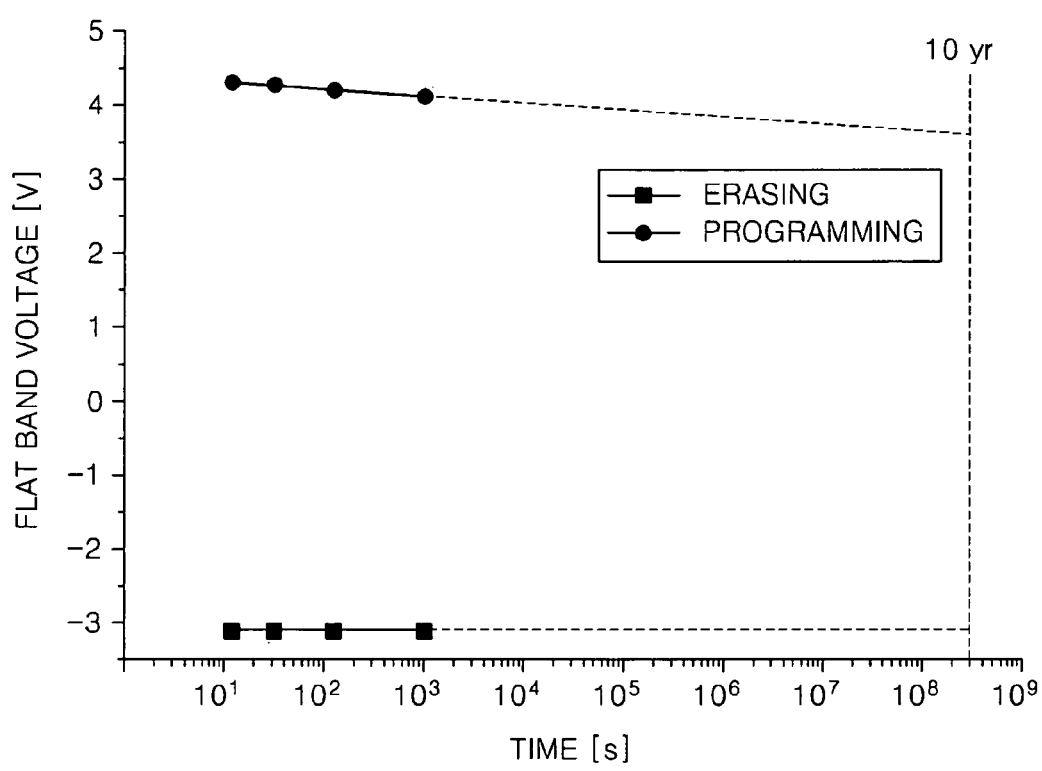

A composite solution prepared by mixing 1 mL of a chloroform solution containing 0.5 wt % Pd nanoparticles and 2 mL of a chloroform solution containing 0.5 wt % $ZrO_2$ nanoparticles is spin-coated at 2000 rpm on a p-type Si substrate on which $SiO_2$ is thermally deposited to form a 5-nm thick tunnel oxide layer. Next, $HfO_2$ is deposited thereon to a thickness of 30 nm using atomic layer deposition (ALD). Next, Al as a gate metal is deposited to a thickness of 300 nm using e-beam evaporation to obtain a memory device. The results of measuring the program-erase characteristics and charge trapping characteristics of the memory device manufactured according to above described process are shown in FIGS. 8 and 9.

The program/erase characteristics and charge retention characteristics of a chare trap memory device according to the present invention will be described with reference to FIGS. 8 and 9. FIGS. 8 and 9 are graphs showing program/erase characteristics and charge retention characteristics of the charge trap memory device according to the present invention.

A sample of the charge trap memory device according to the present invention used to obtain the results in FIGS. 8 and 9 was manufactured as follows.

A 5-nm-thick tunnel insulating layer 21, for example, a tunnel oxide layer, is formed on a p-type substrate 11. The tunnel insulating layer 21 is formed using a silicon-thermal-oxide method. A composite solution of Pd nanoparticles and $ZrO_2$ nanoparticles in a ratio of 1:2 was coated on the tunnel insulating layer 21 and solidified to form the charge trapping layer 23(23') containing the composite of the Pd nanoparticles and the $ZrO_2$ nanoparticles. Here, the Pd nanoparticles are charge trapping nanoparticles 23a, and the $ZrO_2$ nanoparticles are insulating nanoparticles 23b. The blocking insulating layer 25, i.e., a control oxide layer, is formed on the charge trapping layer 23(23') to a thickness of 30 nm. The blocking insulating layer 25 is formed by depositing $HfO_2$ using atomic layer deposition (ALD). The gate electrode 27 is formed by depositing Al on the blocking insulating layer 25 to a thickness of 300 nm using e-beam evaporation.

FIG. 8 is a graph of flat band voltage (V) versus the duration of pulse bias voltage supplied to allow a programming/erasing operation to be performed in the sample charge trap memory. The results of FIG. 8 were obtained by programming using a 18V pulse bias voltage and erasing using a −18V negative pulse bias voltage.

FIG. 9 is a graph showing the retention characteristics of the sample charge trap memory with respect to time. As is apparent from FIG. 9, the flat band voltage barely changes with time in a program state and in an erase state. Referring to FIG. 9, a change (ΔVfb) in flat band voltage in the program state for 10 years is about 0.7V, and a change (ΔVfb) in flat band voltage in the erase state for 10 years is less than 0.1V.

It can be confirmed from FIG. 9 that the charge trap memory device according to the present invention has good hole retention characteristics.

Although the use of the composite of the charge trapping nanoparticles 23a and insulating nanoparticles 23b suggested in the present invention to form the charge trapping layer 23(23') of the charge trap memory device 10(10') is described above, the use of the composite suggested in the present invention is not limited to the charge trap memory device 10(10') and can be used in various devices, for example, a solar cell, etc.

In a charge trap memory device according to the present invention, the charge trapping layer is formed of a composite of charge trapping nanoparticles and insulating nanoparticles. The charge trapping layer is formed by solidifying a composite solution of the charge trapping nanoparticles and the insulating nanoparticles. The charge trapping nanoparticles and the insulating nanoparticles are capped with a surfactant in a liquid synthesis process using an organic solvent to allow the charge trapping nanoparticles and the insulating nanoparticles to be miscible together.

Thus, since the charge trapping nanoparticles exist between the insulating nanoparticles, the agglomeration of the charge trapping nanoparticles, which occurs when manufacturing a memory device using only charge trapping nanoparticles, is prevented.

The charge trap memory device according to the present invention has excellent retention characteristics due to the charge trapping layer formed of a composite of the charge trapping nanoparticles and the insulating nanoparticles.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A charge trap memory device comprising:
   a substrate; and
   a gate structure including a charge trapping layer, wherein the charge trapping layer is formed of a composite of charge trapping nanoparticles and insulating nanoparticles.

2. The charge trap memory device of claim 1, wherein the composite is prepared by solidifying a composite solution of charge trapping nanoparticles and insulating nanoparticles, and the charge trapping nanoparticles and the insulating nanoparticles in the composite solution are capped with a surfactant by a liquid synthesis process using an organic solvent to allow the charge trapping nanoparticles and the insulating nanoparticles to be miscible together.

3. The charge trap memory device of claim 2, wherein the charge trapping nanoparticles comprise any one kind of nanoparticles or at least two kinds of nanoparticles selected from among metal nanoparticles of at least one element or an alloy of at least two elements selected from the group consisting of Pt, Pd, Ni, Ru, Co, Cr, Mo, W, Mn, Fe, Ru, Os, Ph, Ir, Ta, Au, and Ag; Group IV semiconductor nanoparticles selected from monoatomic compounds including Si and Ge and binary compounds including SiC and SiGe; Group II-VI compound semiconductor nanoparticles selected from the group consisting of binary compounds including CdSe, CdTe, ZnS, ZnSe, ZnTe, ZnO, HgS, HgSe, and HgTe, ternary compounds including CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, and HgZnSe, quaternary compounds including HggZnTe, CdZnSeS, CdZnSeTe, CdZnSTe, CdHgSeS, CdHgSeTe, CdHgSTe, HgZnSeS, HgZnSeTe, and HgZnSTe; Group III-V compound semiconductor nanoparticles selected from the group consisting of binary compounds including GaN, GaP, GaAs, GaSb, AlN, AlP, AlAs, AlSb, InN, InP, InAs, and InSb, ternary compounds including GaNP, GaNAs, GaNSb, GaPAs, GaPSb, AlNP, AlNAs, AlNSb, AlPAs, AlPSb, InNP, InNAs, InNSb, InPAs, InPSb, and GaAlNP, and quaternary compounds including GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, and InAlPSb; and Group IV-VI compound semiconductor nanoparticles selected from the group consisting of binary compounds including SnS, SnSe, SnTe, PbS, PbSe, and PbTe, ternary compounds including SnSeS, SnSeTe, SnSTe, PbSeS, PbSeTe, PbSTe, SnPbS, SnPbSe, and SnPbTe, and quaternary compounds including SnPbSSe, SnPbSeTe, and SnPbSTe, and the insulating nanoparticles comprise at least one kind of nanoparticles selected from the group consisting of oxide nanoparticles including ZnO, $ZrO_2$, $SiO_2$, $SnO_2$, $TiO_2$, $HfO_2$, $BaTiO_3$, $CeO_2$, $Al_2O_3$, $Ta_2O_5$, and $In_2O_3$; nitride nanoparticles including silicon nitride and silicon oxynitride; nanoparticles including C(carbon or diamond); Group II-V compound semiconductor nanoparticles; and Group II-V compound semiconductor nanoparticles.

4. The charge trap memory device of claim 3, wherein the surfactant is at least one selected from the group consisting of a $C_6$-$C_{22}$ alkane or alkene group having a —COOH group at its terminal; a $C_6$-$C_{22}$ alkane or alkene group having a —POOH group at its terminal; a $C_6$-$C_{22}$ alkane or alkene group having a —SOOH group at its terminal; and a $C_6$-$C_{22}$ alkane or alkene group having a —$NH_2$ group at its terminal.

5. The charge trap memory device of claim 4, wherein the surfactant is at least one selected from the group consisting of oleic acid, stearic acid, palmitic acid, hexyl phosphonic acid, n-octyl phosphonic acid, tetradecyl phosphonic acid, octadecyl phosphonic acid, n-octyl amine, and hexadecyl amine.

6. The charge trap memory device of claim 2, wherein the surfactant is at least one selected from the group consisting of a $C_6$-$C_{22}$ alkane or alkene group having a —COOH group at its terminal; a $C_6$-$C_{22}$ alkane or alkene group having a —POOH group at its terminal; a $C_6$-$C_{22}$ alkane or alkene group having a —SOOH group at its terminal; and a $C_6$-$C_{22}$ alkane or alkene group having a —$NH_2$ group at its terminal.

7. The charge trap memory device of claim 6, wherein the surfactant is at least one selected from the group consisting of oleic acid, stearic acid, palmitic acid, hexyl phosphonic acid, n-octyl phosphonic acid, tetradecyl phosphonic acid, octadecyl phosphonic acid, n-octyl amine, and hexadecyl amine.

8. The charge trap memory device of claim 1, wherein the charge trapping nanoparticles comprise any one kind of nanoparticles or at least two kinds of nanoparticles selected from among metal nanoparticles of at least one element or an alloy of at least two elements selected from the group consisting of Pt, Pd, Ni, Ru, Co, Cr, Mo, W, Mn, Fe, Ru, Os, Ph, Ir, Ta, Au, and Ag; Group IV semiconductor nanoparticles selected from monoatomic compounds including Si and Ge and binary compounds including SiC and SiGe; Group II-VI compound semiconductor nanoparticles selected from the group consisting of binary compounds including CdSe, CdTe, ZnS, ZnSe, ZnTe, ZnO, HgS, HgSe, and HgTe, ternary compounds including CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, and HgZnSe, quaternary compounds including HggZnTe, CdZnSeS, CdZnSeTe, CdZnSTe, CdHgSeS, CdHgSeTe, CdHgSTe, HgZnSeS, HgZnSeTe, and HgZnSTe; Group III-V compound semiconductor nanoparticles selected from the group consisting of binary compounds including GaN, GaP, GaAs, GaSb, AlN, AlP, AlAs, AlSb, InN, InP, InAs, and InSb, ternary compounds including GaNP, GaNAs, GaNSb, GaPAs, GaPSb, AlNP, AlNAs, AlNSb, AlPAs, AlPSb, InNP, InNAs, InNSb, InPAs, InPSb, and GaAlNP, and quaternary compounds including GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, and InAlPSb; and Group IV-VI compound semiconductor nanoparticles selected from the group consisting of binary compounds including SnS, SnSe, SnTe, PbS, PbSe, and PbTe, ternary compounds including SnSeS, SnSeTe, SnSTe, PbSeS, PbSeTe, PbSTe, SnPbS, SnPbSe, and SnPbTe, and quaternary compounds including SnPbSSe, SnPbSeTe, and SnPbSTe.

9. The charge trap memory device of claim 2, wherein the insulating nanoparticles comprise at least one kind of nanoparticles selected from the group consisting of oxide nanoparticles including $ZnO$, $ZrO_2$, $SiO_2$, $SnO_2$, $TiO_2$, $HfO_2$, $BaTiO_3$, $CeO_2$, $Al_2O_3$, $Ta_2O_5$, and $In_2O_3$; nitride nanoparticles including silicon nitride and silicon oxynitride; nanoparticles including C(carbon or diamond); Group II-V compound semiconductor nanoparticles; and Group II-V compound semiconductor nanoparticles.

10. The charge trap memory device of claim 1, wherein the insulating nanoparticles are composed of a material having a larger energy band gap than the charge trapping nanoparticles.

11. The charge trap memory device of claim 1, wherein the gate structure further comprises:
 a tunnel insulating layer between the substrate and the charge trapping layer;
 a blocking insulating layer formed on the charge trapping layer; and
 a gate electrode formed on the blocking insulating layer.

12. The charge trap memory device of claim 11, further comprising first and second impurity regions in the substrate, the first and second impurity regions contacting the tunnel insulating layer.

13. A method of manufacturing a charge trap memory device comprising a gate structure including a charge trapping layer on a substrate, the method comprising forming the gate structure including forming the charge trapping layer,
 wherein the forming of the charge trapping layer comprises:
  coating a composite solution of charge trapping nanoparticles and insulating nanoparticles; and
  solidifying the composite solution to form composite of charge trapping nanoparticles and insulating nanoparticles for the charge trapping layer.

14. The method of claim 13, wherein the composite solution is coated using one of spin coating, dip coating, drop casting, and self-assembling.

15. The method of claim 13, wherein the charge trapping nanoparticles and the insulating nanoparticles in the composite solution are capped with a surfactant by a liquid synthesis process using an organic solvent to allow the charge trapping nanoparticles and the insulating nanoparticles to be miscible together.

16. The method of claim 15, wherein the charge trapping nanoparticles comprise any one kind of nanoparticles or at least two kinds of nanoparticles selected from among metal nanoparticles of at least one element or an alloy of at least two elements selected from the group consisting of Pt, Pd, Ni, Ru, Co, Cr, Mo, W, Mn, Fe, Ru, Os, Ph, Ir, Ta, Au, and Ag; Group IV semiconductor nanoparticles selected from monoatomic compounds including Si and Ge and binary compounds including SiC and SiGe; Group II-VI compound semiconductor nanoparticles selected from the group consisting of binary compounds including CdSe, CdTe, ZnS, ZnSe, ZnTe, ZnO, HgS, HgSe, and HgTe, ternary compounds including CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, and HgZnSe, quaternary compounds including HggZnTe, CdZnSeS, CdZnSeTe, CdZnSTe, CdHgSeS, CdHgSeTe, CdHgSTe, HgZnSeS, HgZnSeTe, and HgZnSTe; Group III-V compound semiconductor nanoparticles selected from the group consisting of binary compounds including GaN, GaP, GaAs, GaSb, AlN, AlP, AlAs, AlSb, InN, InP, InAs, and InSb, ternary compounds including GaNP, GaNAs, GaNSb, GaPAs, GaPSb, AlNP, AlNAs, AlNSb, AlPAs, AlPSb, InNP, InNAs, InNSb, InPAs, InPSb, and GaAlNP, and quaternary compounds including GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, and InAlPSb; and Group IV-VI compound semiconductor nanoparticles selected from the group consisting of binary compounds including SnS, SnSe, SnTe, PbS, PbSe, and PbTe, ternary compounds including SnSeS, SnSeTe, SnSTe, PbSeS, PbSeTe, PbSTe, SnPbS, SnPbSe, and SnPbTe, and quaternary compounds including SnPbSSe, SnPbSeTe, and SnPbSTe, and
 the insulating nanoparticles comprise at least one kind of nanoparticles selected from the group consisting of oxide nanoparticles including $ZnO$, $ZrO_2$, $SiO_2$, $SnO_2$, $TiO_2$, $HfO_2$, $BaTiO_3$, $CeO_2$, $Al_2O_3$, $Ta_2O_5$, and $In_2O_3$; nitride nanoparticles including silicon nitride and silicon oxynitride; nanoparticles including C(carbon or diamond); Group II-V compound semiconductor nanoparticles; and Group II-V compound semiconductor nanoparticles.

17. The method of claim 16, wherein the surfactant is at least one selected from the group consisting of a $C_6$-$C_{22}$ alkane or alkene group having a —COOH group at its terminal; a $C_6$-$C_{22}$ alkane or alkene group having a —POOH group at its terminal; a $C_6$-$C_{22}$ alkane or alkene group having a —SOOH group at its terminal; and a $C_6$-$C_{22}$ alkane or alkene group having a —NH$_2$ group at its terminal.

18. The method of claim 17, wherein the surfactant is at least one selected from the group consisting of oleic acid, stearic acid, palmitic acid, hexyl phosphonic acid, n-octyl phosphonic acid, tetradecyl phosphonic acid, octadecyl phosphonic acid, n-octyl amine, and hexadecyl amine.

19. The method of claim 15, wherein the surfactant is at least one selected from the group consisting of a $C_6$-$C_{22}$ alkane or alkene group having a —COOH group at its terminal; a $C_6$-$C_{22}$ alkane or alkene group having a —POOH group at its terminal; a $C_6$-$C_{22}$ alkane or alkene group having a —SOOH group at its terminal; and a $C_6$-$C_{22}$ alkane or alkene group having a —$NH_2$ group at its terminal.

20. The method of claim 19, wherein the surfactant is at least one selected from the group consisting of oleic acid, stearic acid, palmitic acid, hexyl phosphonic acid, n-octyl phosphonic acid, tetradecyl phosphonic acid, octadecyl phosphonic acid, n-octyl amine, and hexadecyl amine.

21. The method of claim 14, wherein the charge trapping nanoparticles comprise any one kind of nanoparticles or at least two kinds of nanoparticles selected from among metal nanoparticles of at least one element or an alloy of at least two elements selected from the group consisting of Pt, Pd, Ni, Ru, Co, Cr, Mo, W, Mn, Fe, Ru, Os, Ph, Ir, Ta, Au, and Ag; Group IV semiconductor nanoparticles selected from monoatomic compounds including Si and Ge and binary compounds including SiC and SiGe; Group II-VI compound semiconductor nanoparticles selected from the group consisting of binary compounds including CdSe, CdTe, ZnS, ZnSe, ZnTe, ZnO, HgS, HgSe, and HgTe, ternary compounds including CdSeS, CdSeTe, CdالسTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, and HgZnSe, quaternary compounds including HggZnTe, CdZnSeS, CdZnSeTe, CdZnSTe, CdHgSeS, CdHgSeTe, CdHgSTe, HgZnSeS, HgZnSeTe, and HgZnSTe; Group III-V compound semiconductor nanoparticles selected from the group consisting of binary compounds including GaN, GaP, GaAs, GaSb, AlN, AlP, AlAs, AlSb, InN, InP, InAs, and InSb, ternary compounds including GaNP, GaNAs, GaNSb, GaPAs, GaPSb, AlNP, AlNAs, AlNSb, AlPAs, AlPSb, InNP, InNAs, InNSb, InPAs, InPSb, and GaAlNP, and quaternary compounds including GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, and InAlPSb; and Group IV-VI compound semiconductor nanoparticles selected from the group consisting of binary compounds including SnS, SnSe, SnTe, PbS, PbSe, and PbTe, ternary compounds including SnSeS, SnSeTe, SnSTe, PbSeS, PbSeTe, PbSTe, SnPbS, SnPbSe, and SnPbTe, and quaternary compounds including SnPbSSe, SnPbSeTe, and SnPbSTe.

22. The method of claim 13, wherein the insulating nanoparticles comprise at least one kind of nanoparticles selected from the group consisting of oxide nanoparticles including ZnO, $ZrO_2$, $SiO_2$, $SnO_2$, $TiO_2$, $HfO_2$, $BaTiO_3$, $CeO_2$, $Al_2O_3$, $Ta_2O_5$, and $In_2O_3$; nitride nanoparticles including silicon nitride and silicon oxynitride; nanoparticles including C(carbon or diamond); Group II-V compound semiconductor nanoparticles; and Group III-V compound semiconductor nanoparticles.

23. The method of claim 13, wherein the insulating nanoparticles are composed of a material having a larger energy band gap than the charge trapping nanoparticles.

24. The method of claim 13, wherein the forming of the gate structure further comprises:

forming a tunnel insulating layer on the substrate before the forming of the charge trapping layer; forming a blocking insulating layer on the charge trapping layer; and forming a gate electrode on the blocking insulating layer.

25. The method of claim 24, further comprising forming first and second impurity regions in the substrate, the first and second impurity regions contacting the tunnel insulating layer.

* * * * *